United States Patent [19]

Cheng

[11] Patent Number: 5,023,230
[45] Date of Patent: Jun. 11, 1991

[54] OXIDE SUPERCONDUCTORS ENCASED IN PAN-DERIVED CARBON MATRIX

[75] Inventor: Huai N. Cheng, Wilmington, Del.

[73] Assignee: Hercules Incorporated, Wilmington, Del.

[21] Appl. No.: 376,469

[22] Filed: Jul. 7, 1989

Related U.S. Application Data

[63] Continuation-in-part of Ser. No. 94,190, Sep. 8, 1987.

[51] Int. Cl.$^5$ .............................................. H01L 39/12
[52] U.S. Cl. ........................................ 505/1; 252/502; 252/506; 252/509; 252/511; 264/29.1; 264/29.6; 264/60; 423/447.1; 423/447.5; 423/447.6; 428/408; 428/902; 428/930; 505/739; 505/740; 505/742; 505/785
[58] Field of Search ................ 428/408, 902, 930; 423/447.1, 447.2, 447.5, 447.6; 264/29.1, 29.2, 29.4, 29.6, 29.7, 59, 60, 62; 252/502, 506, 509, 511; 505/1, 739, 740, 742, 785, 822

[56] References Cited

U.S. PATENT DOCUMENTS

| | | | |
|---|---|---|---|
| 4,581,289 | 4/1986 | Dietrich et al. | 428/379 |
| 4,585,696 | 4/1986 | Dustmann et al. | 428/375 |
| 4,776,978 | 10/1988 | Herron et al. | 252/512 |
| 4,904,424 | 2/1990 | Johnson | 501/88 |

FOREIGN PATENT DOCUMENTS

| | | | |
|---|---|---|---|
| 248432 | 12/1987 | European Pat. Off. | |
| 63-250023 | 10/1988 | Japan | 501/1 |
| 63-267508 | 11/1988 | Japan | 505/1 |
| 1-122522 | 5/1989 | Japan | 505/1 |
| 1-157009 | 6/1989 | Japan | 505/1 |

OTHER PUBLICATIONS

Koinuma et al, *Japanese Journal of Applied Physics*, vol. 26, No. 4, Apr. 1987, pp. L399–L401.
Ishii et al, *Japanese Journal of Applied Physics*, vol. 26, No. 12, Dec. 1987, pp. L1959–L1960.
Gupta et al, Applied Physics Letters, 52(23), Jun. 1988, pp. 1987–1988.
Wada et al, Applied Physics Letters, 52(23), Jun. 1988, pp. 1989–1991.

*Primary Examiner*—Paul Lieberman
*Assistant Examiner*—Linda D. Skaling
*Attorney, Agent, or Firm*—Mark Goldberg

[57] ABSTRACT

Disclosed is a method of preparing a superconductor wherein a precursor oxide mixture is dispersed in an appropriate polymer matrix and shaped into a predetermined form following which the matrix and oxide precursor are respectively carbonized and sintered simultaneously. An alternate method is to separately prepare a superconducting material from the precursor oxide mixture, grind the superconducting material and add it to a solution containing polyacrylonitrile, shape into a predetermined form, following which the superconducting material and matrix are, respectively, carbonized and then annealed.

7 Claims, No Drawings

OXIDE SUPERCONDUCTORS ENCASED IN PAN-DERIVED CARBON MATRIX

This is a continuation-in-part of U.S. patent application Ser. No. 07/094,190, filed Sept. 8, 1987.

This invention relates to the art of preparing superconductors. More specifically, it relates to methods whereby superconducting materials can be provided in a convenient form for technical applications.

It has long been known that certain inorganic materials are capable of conducting electricity virtually resistance-free at temperatures near absolute zero. This property, referred to as superconductivity, has had relatively few practical applications because of the extremely low temperature requirement, which can only be met in a liquid helium environment. Recently, C. W. Chu et al. have reported (58 Physical Review Letters, #9, pages 908–910, 1987) that certain mixed inorganic oxides exhibit superconductivity at significantly higher temperatures, i.e., on the order of 95° K. (known as the superconducting transition temperature or Tc). This discovery is extremely significant as the 95° K. temperature can be provided by a liquid nitrogen environment which is much easier to reach and to maintain than the liquid nitrogen environment of the previously known superconductors.

The known superconducting materials are mixed oxides of cupric copper, a trivalent metal of the lanthanide series, and an alkali earth metal. The specific superconducting material reported by Chu et al. is a mixed oxide of copper ($Cu^{+2}$), yttrium, and barium.

To prepare the superconducting inorganic oxide described by Chu, the oxides are mixed in a specific molar ratio (1:1:2 or 1:2:3) of yttrium:barium:copper. This mixture is milled to the smallest attainable particle size so that the mixture is as nearly homogeneous as possible and it is then subjected to sintering and solid state reaction according to a specific heating and cooling schedule. The controlled sintering drives the solid state reaction of the mixture to the superconductive mixed oxide state. The material is then annealed at lower temperatures in the presence of oxygen.

Being an inorganic material, the superconducting mixed oxide is quite brittle and is not readily converted to a useful shape for most electrical applications. In order for the discovery of Chu et al. to become more than an interesting laboratory curiosity of limited utility, this problem must be overcome. One prior art method of incorporating a superconductor into a carbon fiber was reported by Koyama et al. in Japanese Patent Application No. 74-29919. Koyama et al. placed the carbon fiber into a chamber at reduced atmospheric pressure along with a metal or metal salt and subjected the materials to heat. Enough of the metal was absorbed into the fiber to have a superconductor. However, these materials had a Tc of only several degrees Kelvin and the intercalation method of Koyama is an inefficient way of combining two materials. In order for the new high temperature superconductors to have utility in a broad range of applications, it will necessary to develop superconductors having a critical density in the range of 50,000 amps/cm². The high temperature superconductors disclosed in the literature as of the date of this application fall short of that critical density at least by a factor of 10. However, in many applications, such as shielding from electromagnetic interference, such a critical density is unnecessary. Although this invention is primarily concerned with teaching the incorporation of a superconductor into a wire or fiber, the invention can also be used to use PAN-based carbon fibers as a means to mold the superconductors into laminates in applications such as the EMI shielding. The carbon fiber, in contrast to epoxies and other potential binders, conducts electricity.

The prior art contains teachings of incorporation of various materials into a carbon matrix. For example, in U.S. Pat. No. 4,126,652 the incorporation of pure metals into a carbon matrix is disclosed. This is a straightforward process because metals are easy to work with and have no particular thermal processing requirements. In contrast, high temperature superconductors are well known to be highly sensitive to thermal treatment and oxygen stoichiometry. The processing of high temperature superconductors is an art form that the present invention teaches.

It is therefore an object of this invention to teach techniques for providing superconductive materials in an organic matrix. A further object of this invention is to provide workable means to produce superconductive tapes, films, fibers, or rods. The resulting material may be used as an EMI shielding material.

In the descriptions which follow, the term superconductor will be used to describe a superconductive structure, i.e., a tape, film, rod or filament. Superconductive or superconducting material will mean a mixed inorganic oxide which has been rendered superconductive by sintering and annealing. Oxide precursor will mean a mixture of inorganic compounds prior to the sintering step wherein they are reacted and rendered superconductive.

In accordance with this invention, there is provided a process for preparing a superconductor which comprises dispersing finely divided oxide precursor in a carbon matrix, forming said dispersion into a tape, film, fiber, or rod, and simultaneously carbonizing said carbon matrix and sintering the oxide precursor in the presence of oxygen to render it superconductive. Alternately, instead of simultaneously preparing the superconductive material, there is provided a process for making a superconductor comprising previously made superconductive material dispersed in a carbon matrix.

In a first process to produce a superconducting carbon matrix, the oxide precursor can be incorporated into the polyacrylonitrile by dispersing the finely divided precursor in a solution of the polyacrylonitrile and solvent spinning of the polymer to form a filament. The same solution can, of course, also be cast or extruded to form a film or a tape. These filaments, films and tapes can be employed in laminates to provide shielding against electromagnetic pulse. Solution spinning or casting of polyacrylonitrile is a known art which can be carried out according to known techniques.

In another technique found useful for dispersing the oxide precursor in the polyacrylonitrile in the practice of the above method, the oxide precursor and the PAN are first dissolved, or dispersed, individually, in a nonsolvent liquid and, after thorough dispersal, the two dispersions are intimately mixed. The intimate mixture is then shaped and subjected to temperatures sufficient to drive off the suspending liquid(s) and consolidate the PAN/oxide precursor mixture. Upon heating, the PAN particles melt and fuse, encasing the oxide precursor particles. The fused mass is then extruded or molded in the desired shape and subjected to elevated temperatures to effect carbonization and to form the superconducting mixed oxide as explained above. The polyacrylonitrile-derived carbon serves as the "glue" that holds the superconducting part together and permits processing to be accomplished. The final product has a minimal amount of carbon, with more than 90% of the carbon burnt off during process.

Optimum conductivity in the superconductors depends upon homogeneous blending of the three inorganic compounds and intimate contact between the oxide particles within the carbon matrix. To this end, the particles are reduced to very small particle size, i.e., about 0.2 to 3 microns, preferably 0.2 to 2 microns. Size reduction can be achieved by known means as, e.g., by pulverizing in a mortar and pestle, a ball mill or a hammer mill or other convenient means. A relatively high loading of the superconductive material in the matrix is also desirable, i.e., about 25 to 94% by weight, based on the carbon content.

The combination of polyacrylonitrile and the oxide precursor based on yttrium oxide, barium carbonate and cupric oxide is a preferred system for preparing the superconductors according to this invention. A preferred heating schedule that makes a superconducting material is about 250° C. for 2 hours to oxidize the polyacrylonitrile, about 500°–600° C. for one hour or less to remove tar and pitch, then about 800°–950° C. for 12 hours to effect sintering. Following the sintering step, the mixed oxide is cooled at the rate of 100° C. per hour. The entire process was done in air at normal room atmospheric pressure. Most of the carbon was burnt off in the process. However, up to 10% of organic carbon was left behind in the process. The organic carbon serves primarily to mold the superconductor in the desired form. Since a minimal amount of carbon was left by this process any adverse effect that could result from reaction between the carbon and superconducting material was minimized and no such effect was observed.

An alternative method to make a superconductor comprising superconductive material dispersed in a carbon matrix is to disperse finely divided pre-formed superconductor in a polyacrylonitrile solution and removing the solvent. The polymer solutions permit materials to be made in any form: films, tapes, or fibers. A heating schedule is then used to carbonize the polyacrylonitrile followed by annealing at a lower temperature to make a superconducting material based on carbon.

Although simple in concept, the actual process of making a superconducting material by this method requires a lot of basic studies and process variations. The open literature discloses that heating the superconductor above 700° C. in nitrogen will destroy superconductivity. The material after such heating has to be annealed in air or oxygen at around 500° C. to recover the superconductivity (e.g., C. Chen, et al, Rev. Sci. Instrum., 58, 1565 (1987). However, the carbonization of polyacrylonitrile has a different thermal requirement. It requires heating in air at 220°–250° C. for about 2 hours, quick heating to 500°–600° C. for a short time, and then heating to a temperature of up to 1200° C. in nitrogen for a prolonged period. The process of combining both thermal processes and making it workable constitutes a part of this invention.

It is first necessary to find the temperature to which it is necessary to heat a powder sample of Y-Ba-Cu superconductor such that a continuous electric current can be passed through the sample without substantial resistance at ambient temperature. It was found that 650°–700° C. or higher is needed to fuse the individual grains of superconductor together. This temperature requirement is compatible with the temperature needed for the carbonization of polyacrylonitrile (900°–1200° C.). Thus, fortuitously, the heating schedule for carbonizing the polyacrylonitrile is also useful for fusing the individual grains of superconductor together.

One problem with the above temperature requirements is that at temperatures above 700° C. superconductivity will be at least partially lost. Air annealing is necessary to recover the superconductivity. However, the polyacrylonitrile-derived carbon will be burnt off rather quickly at 500° C. in air which is the normal temperature used for annealing. An optimal temperature is needed that can achieve annealing without burning off too much carbon. A temperature between 385°–400° C. has been found suitable for this purpose.

Another process variable that is significant is the carbonization temperature. If the temperature of carbonization of polyacrylonitrile is above about 950° C., superconductivity is lost even with air annealing for an extended period of time. Thus the carbonization temperature should be kept to 950° C., or below.

Based on the above considerations, a preferred process has been developed. The heating schedule for this process (yttrium-barium-copper superconductor powder in polyacrylonitrile) consists of heating the mixture to 235° C. in air to oxidize the polyacrylonitrile (optional step), further heating in nitrogen to 500°–600° C. for a few minutes to remove the organic tar or pitch, and then heating up to 930° C. for 1-2 hours, also in nitrogen, to carbonize the polyacrylonitrile. It is then cooled to 385° C., exposed to air, and annealed at that temperature for 12 hours to recover superconductivity.

Copolymers of acrylonitrile with other monomers, such as, e.g., poly(acrylonitrile-co-acrylic acid), poly(acrylonitrile-co-methacrylic acid), and poly(acrylonitrile-co-methylacrylate-itaconic acid), can also be used. Other materials which have the correct structure for carbonization can be also employed, e.g., pitch and rayon.

The oxide precursor described herein is a mixture of cupric oxide, yttrium oxide, and barium carbonate. In the preferred ratio of oxides, the mole ratio of yttrium to barium to copper is 1:1:2. The ratio can varied to 1:2:3 or other similar stoichiometries. The preferred superconductor has a mole ratio of 1:1:2 or 1:2:3. In addition to yttrium, it has been reported that substitution of other metals of the lanthanide series, e.g., lanthanum, thulium, ytterbium, and europium can exhibit superconductivity (e.g., J. M. Williams, et al., Accts. Chem. Res., 21, 1 (1988)). Furthermore, two new classes of materials consisting of bismuth-calcium-strontium-copper (H. Maeda, et al. Jap. J. Appl. Phys. Lett., 27, L209 (1988)), and thallium-barium-calcium-copper (Z. Z. Sheng et al., Nature, 332, 138 (1988)) are found to be good superconductors.

The superconductors of this invention can be prepared in any convenient end-use form such as fibers, tapes, films, and rods. Accordingly, they can be employed in a variety of applications, e.g., EMI shielding, electric power and magnet technology, cryoelectronics, transportation, magnetic separation, acceleration, and in a variety of new applications which have been foreseen for superconductors, e.g., Josephson devices and superconducting transistors. The superconductors of this invention can be employed in the same applications as superconductors have previously been used such as in nuclear magnetic resonance.

The invention is illustrated in the following examples.

EXAMPLE 1

This example illustrates the preparation of a superconductor from a mixture of polyacrylonitrile powder and cupric oxide, yttrium oxide, and barium carbonate powders.

The following materials were mixed together: 0.71 g of yttrium oxide ($Y_2O_3$), 1.24 g $BaCO_3$, and 1.00 g CuO, and ground to a very fine powder in a mortar and pestle. Then 2 g of neat poly(ethylene oxide), (MW=600) was added and mixed thoroughly to produce a uniform paste. Another paste was prepared similarly, consisting of polyacrylonitrile (2 g) and neat poly(ethylene oxide), (MW=400) (8 g). The two pastes were then mixed together, shaped into a hemisphere, heated at 90° C. for 15 minutes and then at about 350° C. for one hour to burn off the poly(ethylene oxide). The sample was then held at 350° C. in air for 15 hours, 500° C. for 5 hours, and 950° C. for 14 hours. Thereafter the temperature was gradually lowered (at the rate of 100° C. per hour) to room temperature. The resulting sintered and carbonized material exhibited a Tc (transition temperature for superconductivity) of 95° K.

The Tc is determined by measuring the a.c. magnetic susceptibility on the samples. The measurement was carried out on a high sensitivity a.c. mutual inductance bridge monitored by a lock-in amplifier. The a.c. measuring field was about 2 Oe. The temperature range of measurements was 300° K. down to 65° K. using pumped liquid nitrogen as the refrigerant. Tc is noted as a gross change in the magnetic susceptibility.

The sample temperature is measured using an Fe-Au thermocouple with electronic cold-junction compensation. The thermocouple is thermally linked to the sample via a short non-magnetic gold wire. In addition, about 1.5 atm. of helium gas surrounds the sample and thermally links it to the thermocouple. It is estimated that because of the high cool-down rate the temperatures are accurate to about ±5° K. above about 120° K. and to ±3° K. below 100° K.

EXAMPLE 2

This example illustrates the preparation of a superconductor from $Y_2O_3$/CuO/$BaCO_3$ powder and polyacrylonitrile solution.

Four (4) g polyacrylonitrile was dissolved in 27.7 g N,N-dimethylacetamide. Then, 0.71 g $Y_2O_3$, 1.24 g $BaCO_3$, and 1.01 g CuO were uniformly dispersed in 2 g poly(ethylene oxide), MW=600. The resulting paste was added to 8.18 g of the polyacrylonitrile/ N,N-dimethylacetamide solution. A grey, solid material was obtained. This was heated at about 175° C. to remove the N,N-dimethylacetamide, and then heated progressively at 200° C. (1 hour), 250° to 280° C. (12 hours), 500° C. (1 hr.), and 950° C. (12.5 hours). The sintered, carbonized material was then cooled at approximately 100° C. per hour to room temperature. By the technique explained in Example 1, it was determined to have a Tc equal to 96° K.

EXAMPLE 3

This example illustrates the preparation of a superconductor film from Y-Ba-Cu superconducting powder and polyacrylonitrile solution.

A 5% weight solution of polyacrylonitrile in N,N-dimethylacetamide was first prepared. A sample of Y-Ba-Cu superconductor (mole ratio 1:1:2) was ground into a fine powder and mixed in with the polyacrylonitrile solution. (Weight of superconductor was 0.671 g; weight of solution was 0.877 g.) The dimethylacetamide was allowed to evaporate to dryness, leaving behind a black film containing polyacrylonitrile and superconductor. This sample was placed in a Fisher air-tight quartz crucible and heated to 900° C. in the absence of oxygen for 1.5 hours, and then cooled to 385° C. and allowed to anneal in air for 12 hours at that temperature. The resulting material is superconducting by both ac magnetic susceptibility and low-temperature current resistivity measurements. The Tc was about 94° K.

EXAMPLE 4

This example illustrates the preparation of superconducting wire from Y-Ba-Cu superconducting powder and polyacrylonitrile solution. A 15% solution of polyacrylonitrile was made with dimethylsulfoxide, and Y-Ba Cu superconductor (mole ratio 1:1:2) was added up to 4.5% by weight. The solution was stirred and extruded through a glass syringe into a water bath to form wires. The wires were dried and wound on a quartz tubing and placed in an Astro-furnace at 950° C. in nitrogen for 2 hours. The wires were then annealed in air for 12 hours at 385° C. By ac magnetic susceptibility measurement this sample was determined to have a Tc of about 92° K.

What I claim is:

1. A method of preparing a superconductor which comprises intimately dispersing a finely divided cupric oxide, yttrium oxide and barium carbonate precursor mixture in a stoichiometric ratio such that a superconductor will result, in a polyacrylonitrile polymer, wherein said precursor mixture is from about 23% to about 94% by weight in said polymer, forming the resulting dispersion into a film, tape, rod, or fiber and subjecting the formed dispersion to an elevated temperature of between about 800° C. to about 950° C. for about 12 hours whereby at said elevated temperature the polyacrylonitrile polymer is carbonized and the finely divided mixture is at the same time sintered in the presence of oxygen and rendered superconductive at a transition temperature for superconductivity of about 95° K. wherein at said temperature a gross change in magnetic susceptibility occurs, and wherein following said 12 hour heating of the formed dispersion at least a sufficient amount of carbon remains to act as a carbon matrix for, and to maintain the shape of, said film, tape, rod or fiber.

2. The method of claim 1 wherein the mole ratio of copper to barium to yttrium is 2:1:1 or 3:2:1.

3. The method of claim 2 wherein said precursor mixture is from about 30% to about 75% by weight of said carbon matrix.

4. The method of claim 2 wherein the finely divided mixture and polyacrylonitrile polymer are heated at a temperature in the range from about 220° C. to about 250° C. for about 2 hours to oxidize the polyacrylonitrile polymer, then at a temperature in the range of from about 500° C. to about 600° C. for about one hour to remove tar and pitch, then at a temperature in the range of from about 900° C. to about 950° C. for about 12 hours to effect sintering and then at temperature in the range of about 385° C. to about 400° C. to effect annealing.

5. A method of preparing a superconductor in a polyacrylonitrile derived carbon matrix which comprises intimately dispersing a finely divided yttrium-barium-copper oxide superconductor in a polyacrylonitrile solution, forming the resulting dispersion into a film, tape, rod, or fiber and subjecting the formed dispersion to an elevated temperature in a range from about 800° C. to about 950° C. for 1-2 hours in the absence of oxygen whereby at said elevated temperature the polyacrylonitrile polymer is carbonized wherein sufficient carbon remains to act as a carbon matrix and bind the finely divided superconducting mixture together and the finely divided mixture is fused followed by cooling to a temperature in the range from about 385° C. to about 400° C. in the presence of oxygen for about 12 hours to regain superconductive properties at a transition temperature for superconductivity of about 94° K. wherein at said temperature a gross change in magnetic susceptibility is noted.

6. The method of claim 5 wherein said formed dispersion is first heated in air at about 235° C. to oxidize the polyacrylonitrile followed by heating in nitrogen at a temperature in the range of from about 500° C. to about 600° C. for a few minutes to remove organic tar or pitch.

7. The method of claim 6 wherein said formed dispersion is carbonized at about 935° C. and annealed at about 385° C.

* * * * *